United States Patent
Kim et al.

(10) Patent No.: US 12,224,465 B2
(45) Date of Patent: Feb. 11, 2025

(54) VOLTAGE DETECTION SYSTEM AND METHOD OF FUEL CELL STACK

(71) Applicant: HYUNDAI KEFICO CORPORATION, Gyeonggi-do (KR)

(72) Inventors: Sung Ho Kim, Gyeonggi-do (KR); Ji Hye Park, Gyeonggi-do (KR)

(73) Assignee: Hyundai Kefico Corporation, Gyeonggi-do (KR)

( * ) Notice: Subject to any disclaimer, the term of this patent is extended or adjusted under 35 U.S.C. 154(b) by 564 days.

(21) Appl. No.: 17/677,758

(22) Filed: Feb. 22, 2022

(65) Prior Publication Data

US 2022/0271309 A1     Aug. 25, 2022

(30) Foreign Application Priority Data

Feb. 22, 2021  (KR) ........................ 10-2021-0023375

(51) Int. Cl.
*H01M 8/04* (2016.01)
*G01R 19/165* (2006.01)
*H01M 8/04537* (2016.01)
*H01M 8/04664* (2016.01)

(52) U.S. Cl.
CPC ...... *H01M 8/04559* (2013.01); *G01R 19/165* (2013.01); *H01M 8/04679* (2013.01)

(58) Field of Classification Search
CPC .......... H01M 8/04556; H01M 8/04679; G01R 19/165

USPC ......................................................... 429/432
See application file for complete search history.

(56) References Cited

U.S. PATENT DOCUMENTS

| | | | |
|---|---|---|---|
| 6,313,750 B1 * | 11/2001 | Lacy | G01R 31/396 340/636.15 |
| 2008/0191702 A1 * | 8/2008 | Coenen | G01R 31/389 324/434 |
| 2015/0009733 A1 * | 1/2015 | Takaki | G05F 1/67 363/97 |
| 2016/0116539 A1 * | 4/2016 | Shiokawa | H01M 8/04559 324/426 |
| 2017/0045588 A1 * | 2/2017 | Aoki | H01M 8/04992 |

FOREIGN PATENT DOCUMENTS

| | | |
|---|---|---|
| JP | 2008-010176 A | 1/2008 |
| JP | 2011-040218 A | 2/2011 |
| JP | 2018-116864 A | 7/2018 |
| KR | 10-2006-0089842 A | 8/2006 |
| KR | 2006-0118465 A | 11/2006 |
| KR | 101592768 B1 | 2/2016 |
| KR | 10-2018-0112382 A | 10/2018 |

* cited by examiner

*Primary Examiner* — James M Erwin
(74) *Attorney, Agent, or Firm* — Fox Rothschild LLP

(57) ABSTRACT

Disclosed is a voltage detection system of a fuel cell stack, which includes: a stack detection unit comparing input voltage and reference voltage when voltage of a fuel cell stack is input, and outputting a comparison result; and a determination unit determining whether negative voltage is generated in the fuel cell stack based on output voltage of the stack detection unit and a reference duty used for generation of the reference voltage.

11 Claims, 4 Drawing Sheets

VOLTAGE DETECTION SYSTEM AND METHOD OF FUEL CELL STACK

CROSS-REFERENCE TO RELATED APPLICATIONS

This application claims priority to and the benefit of Korean Patent Application No. 10-2021-0023375 filed in the Korean Intellectual Property Office on Feb. 22, 2021, the entire contents of which are incorporated herein by reference.

TECHNICAL FIELD

The present invention relates to a system and a method for voltage detection of a fuel cell stack.

BACKGROUND ART

In recent years, development of a fuel cell vehicle has constantly increased as a part for solving global environmental issues.

The fuel cell vehicle is driven by supplying power to an electric motor by using a fuel cell stack. The fuel cell stack mounted on the fuel cell vehicle generates electric energy by using a chemical reaction of hydrogen fuel and oxygen.

When the fuel cell stack cannot normally generate power, the fuel cell stack may have negative voltage, and malfunction and permanent damage may occur due to the negative voltage. As a result, an apparatus is required, which is capable of taking a proper measure by sensing the negative voltage of the fuel cell stack.

SUMMARY OF THE INVENTION

In preferred aspects, provided are a system and a method for voltage detection of a fuel cell stack, which detect negative voltage by measuring cell voltage of a fuel cell stack to secure stability of the fuel cell stack, and a method of detecting the voltage of the fuel cell.

In an aspect, provided is a voltage detection system of a fuel cell stack, which includes: a stack detection unit comparing an input voltage and a reference voltage when voltage of a fuel cell stack is input and outputting a comparison result; and a determination unit determining whether negative voltage is generated in the fuel cell stack based on an output voltage of the stack detection unit and a reference duty used for generation of the reference voltage.

The stack detection unit may include an oscillation unit outputting the reference voltage by considering the reference duty, a comparison unit comparing the reference voltage and the input voltage, and an adjustment unit adjusting a voltage level for a comparison result of the comparison unit.

The oscillation unit may generate the reference voltage based on a positive voltage source and a negative voltage source.

The oscillation unit may generate the reference voltage of a triangular wave or sine wave form having a predetermined cycle according to the reference duty.

The comparison unit may output a comparison result of a high level when the input voltage is greater than the reference voltage, and output a comparison result of a low level when the input voltage is less than the reference voltage.

The determination unit may determine that the negative voltage is generated in the fuel cell stack when a duty of the output voltage is less than the reference duty.

In an aspect, provided is a method of detecting a voltage of a fuel cell stack, which includes: receiving voltage of a fuel cell stack; comparing an input voltage and a reference voltage; and determining whether negative voltage is generated in the fuel cell stack based on a comparison result of the comparison step and a reference duty used for generation of the reference voltage.

The voltage detection method may further include outputting the reference voltage by considering a positive voltage source, a negative voltage source, and the reference duty before the input step.

In the comparing the input voltage and the reference voltage, a comparison result of a high level may be output when the input voltage is greater than the reference voltage, and a comparison result of a low level may be output when the input voltage is less than the reference voltage.

In the determination whether negative voltage is generated, it may be determined that the negative voltage is generated in the fuel cell stack when a duty of the comparison result is less than the reference duty.

The voltage detection method may further include an adjustment step of adjusting a voltage level of the comparison result.

According to various exemplary embodiments of the present invention, a system and a method for voltage detection of a fuel cell stack detect negative voltage of a fuel cell stack to take a proper measure. Further, malfunction of the fuel cell stack due to the negative voltage may be prevented.

The foregoing summary is illustrative only and is not intended to be in any way limiting. In addition to the illustrative aspects, embodiments, and features described above, further aspects, embodiments, and features will become apparent by reference to the drawings and the following detailed description.

Other aspects of the invention are disclosed infra.

Figure 1:
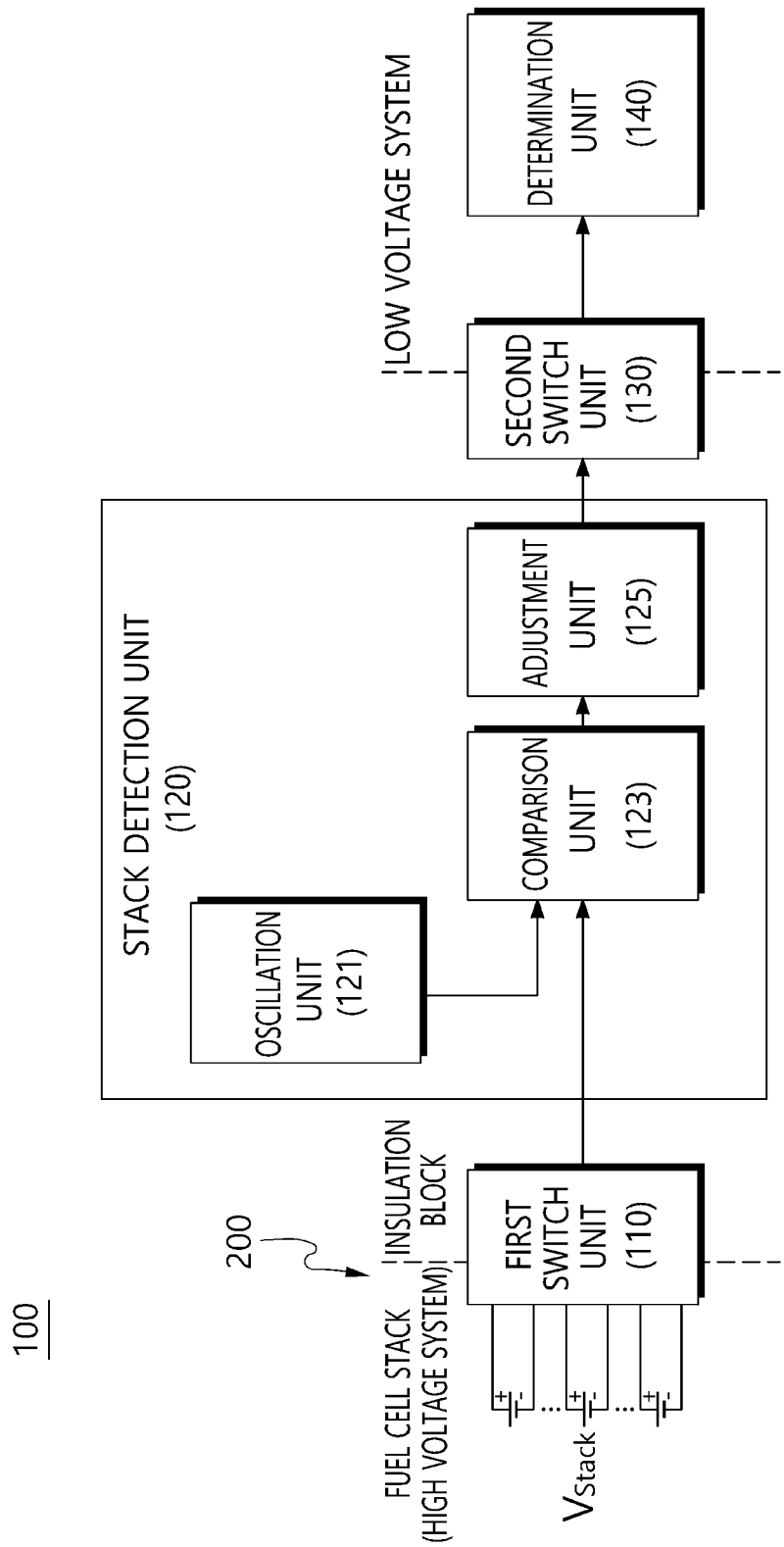
FIG. 1 shows an exemplary voltage detection system of a fuel cell stack according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, an exemplary embodiment of the present invention will be described in detail with reference to the accompanying drawings. First, when reference numerals refer to components of each drawing, it is to be noted that although the same components are illustrated in different drawings, the same components are denoted by the same reference numerals as possible. Further, hereinafter, the exemplary embodiment of the present invention will be described, but the technical spirit of the present invention is not limited thereto or restricted thereby and the embodiments can be modified and variously executed by those skilled in the art.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless otherwise indicated, all numbers, values, and/or expressions referring to quantities of ingredients, reaction conditions, polymer compositions, and formulations used herein are to be understood as modified in all instances by the term "about" as such numbers are inherently approximations that are reflective of, among other things, the various uncertainties of measurement encountered in obtaining such values. Further, unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

FIG. 1 shows an exemplary voltage detection system of a fuel cell stack according to an exemplary embodiment of the present invention.

As shown in FIG. 1, a voltage detection system 100 of a fuel cell stack generates reference voltage by using an oscillation circuit, outputs a digital value according to a different between voltage of the fuel cell stack and the reference voltage, and detects the voltage of the fuel cell stack based on the output digital value.

The voltage detection system 100 of a fuel cell stack may include a first switch unit 110, a stack detection unit 120, a second switch unit 130, and a determination unit 140.

The first switch unit 110 may connect a fuel cell stack 200 and the stack detection unit 120 according to a turn-on operation. The first switch unit 110 may maintain an insulation state of the fuel cell stack 200 and the stack detection unit 120 according to the turn-on operation. The first switch unit 110 may be constituted by various switching elements such as a MOSFET element and a transistor element.

The stack detection unit 120 may detect a state of the fuel cell stack 200. The stack detection unit 120 may be provided in an insulation block. The stack detection unit 120 may include an oscillation unit 121, a comparison unit 123, and an adjustment unit 125.

The oscillation unit 121 may output reference voltage input into the comparison unit 123 in order to measure the voltage of the fuel cell stack 200. An output waveform of the reference voltage may have a form of a sine wave or a triangular wave. The oscillation unit 121 may input the reference voltage generated based on positive (+) voltage and negative (−) voltage of power divided in the insulation block into the comparison unit 123.

The comparison unit 123 sets the reference voltage output from the oscillation unit 121 as reference comparison voltage. The comparison unit 123 may compare the voltage of the fuel cell stack 200 and the reference comparison voltage. The comparison unit 123 outputs a comparison result of a high level or a low level according to a difference between the voltage of the fuel cell stack 200 and the reference comparison voltage.

The adjustment unit 125 may serve to convert the comparison result of the comparison unit 123 into a voltage level which may be recognized by a low voltage system. Output voltage output by the adjustment unit 125 may be a value of which voltage level is adjusted in comparison with the comparison result.

The second switch unit 130 may maintain the insulation state of the stack detection unit 120 and the low voltage system. The second switch unit 130 may serve to connect the stack detection unit 120 and the determination unit 140 of the low voltage system.

The determination unit 140 may determine whether the negative voltage of the fuel cell stack 200 is generated based on the output voltage of the stack detection unit 120. The determination unit 140 may determine that the negative voltage of the fuel cell stack 200 is generated when a duty of the output voltage is less than a reference duty. Here, the reference duty may be set based on a ground.

Figure 2:
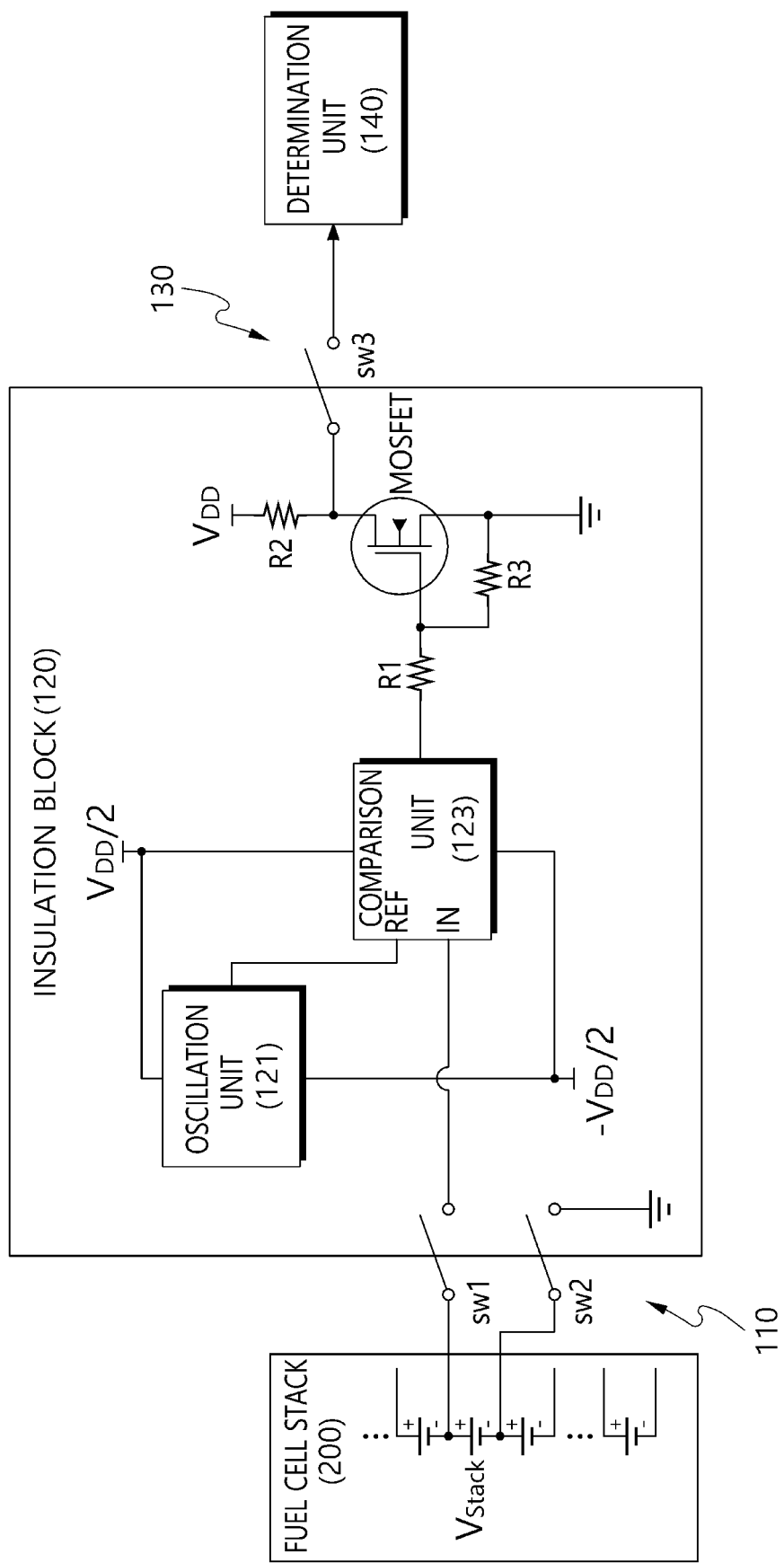
FIG. 2 shows an exemplary circuit configuration of the voltage detection system of a fuel cell stack in FIG. 1.

FIG. 2 shows an exemplary circuit configuration of the voltage detection system of a fuel cell stack in FIG. 1.

As shown in FIG. 2, the first switch unit 110 may include a first switch sw1 and a second switch sw2.

The first switch sw1 may be provided between a positive voltage terminal of a cell of the fuel cell stack 200 and an input terminal IN of the comparison unit 123. The first switch sw1 may perform the turn-on operation when voltage detection of the fuel cell stack 200 is required.

The second switch sw2 may be provided between a negative voltage terminal of the cell of the fuel cell stack 200 and a ground. The second switch sw2 may perform the turn-on operation when the voltage detection of the fuel cell stack 200 is required.

The oscillation unit 121 may be constituted by an RC, LC, and a crystal oscillator including an OP-AMP. The oscillation unit 121 is not limited to the above example, and various oscillation circuits may be applied.

The comparison unit 123 may include a reference input terminal REF into which the reference voltage of the oscillation unit 121 is input, and a stack input terminal IN into which input voltage of the fuel cell stack 200 passing through the first switch sw1 is input.

The comparison unit 123 may output the comparison result of the high level or the low level according to a difference between the reference voltage and the input voltage. The comparison result may have a voltage range of negative voltage source (−VDD/2) to a positive voltage source (VDD/2).

The adjustment unit 125 may include a plurality of resistors R1, R2, and R3, and a MOSFET. A first resistor R1 may be connected between an output terminal of the comparison unit 123 and a gate terminal of the MOSFET. A second resistor R2 may be connected between a positive voltage source (VDD) and a drain terminal of the MOSFET. A third resistor R3 may be connected between the gate terminal of the MOSFET and the ground.

The MOSFET may be applied while being replaced with various other switch elements such as a transistor, etc.

The adjustment unit 125 having the configuration may serve to reduce the voltage level of the comparison result of the comparison unit 123 to 0 to VDD. The adjustment unit 125 may transmit output voltage of which voltage is adjusted to the determination unit 140. The output voltage of the adjustment unit 125 may be inverted according to a circuit configuration.

The second switch unit 130 may include a third switch sw3 provided between the drain terminal of the MOSFET and the determination unit 140. The third switch sw3 may perform the turn-on operation when the voltage detection of the fuel cell stack 200 is required.

The first switch sw1, the second switch sw2, and the third switch sw3 may be a switching element used for a purpose of insulation such as a photoMOS relay or a photo coupler.

Figure 3:
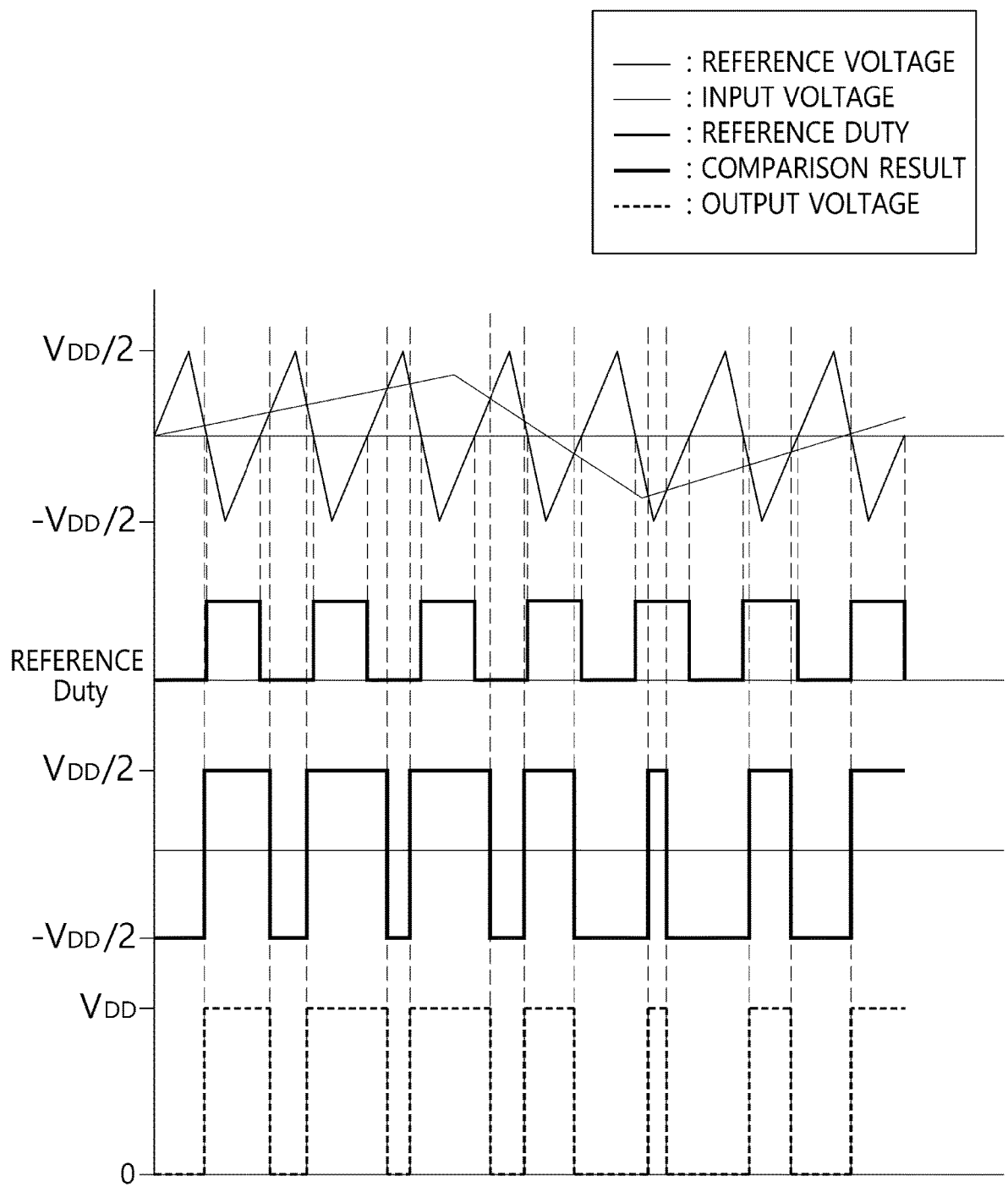
FIG. 3 shows various signals of an exemplary voltage detection system of a fuel cell stack.

FIG. 3 shows various signals of an exemplary voltage detection system of a fuel cell stack.

As shown in FIG. 3, the reference voltage may be the output voltage of the oscillation unit 121, and may be represented as a waveform having a predetermined cycle according to the reference duty. The reference voltage is represented as a similar waveform to a triangular waveform.

The input voltage is the voltage of the fuel cell stack 200 input into the first switch unit 110.

The reference duty may be set based on the ground in order to determine whether the negative voltage of the fuel cell stack 200 is generated. Here, the reference duty may be set to about 50%.

The comparison result is the output voltage of the comparison unit 123 according to the difference between the reference voltage and the input voltage. The comparison result has the high level when the input voltage is greater than the reference voltage. The comparison result has the low level when the input voltage is less than the reference voltage.

The output voltage is an output value of the stack detection unit 120. The output voltage may be a value of which voltage level is adjusted in comparison with the comparison result. The output voltage is input into the determination unit 140 through the second switch unit 130. The output voltage may be a state when the negative voltage is generated when the duty is smaller than the reference duty.

Figure 4:
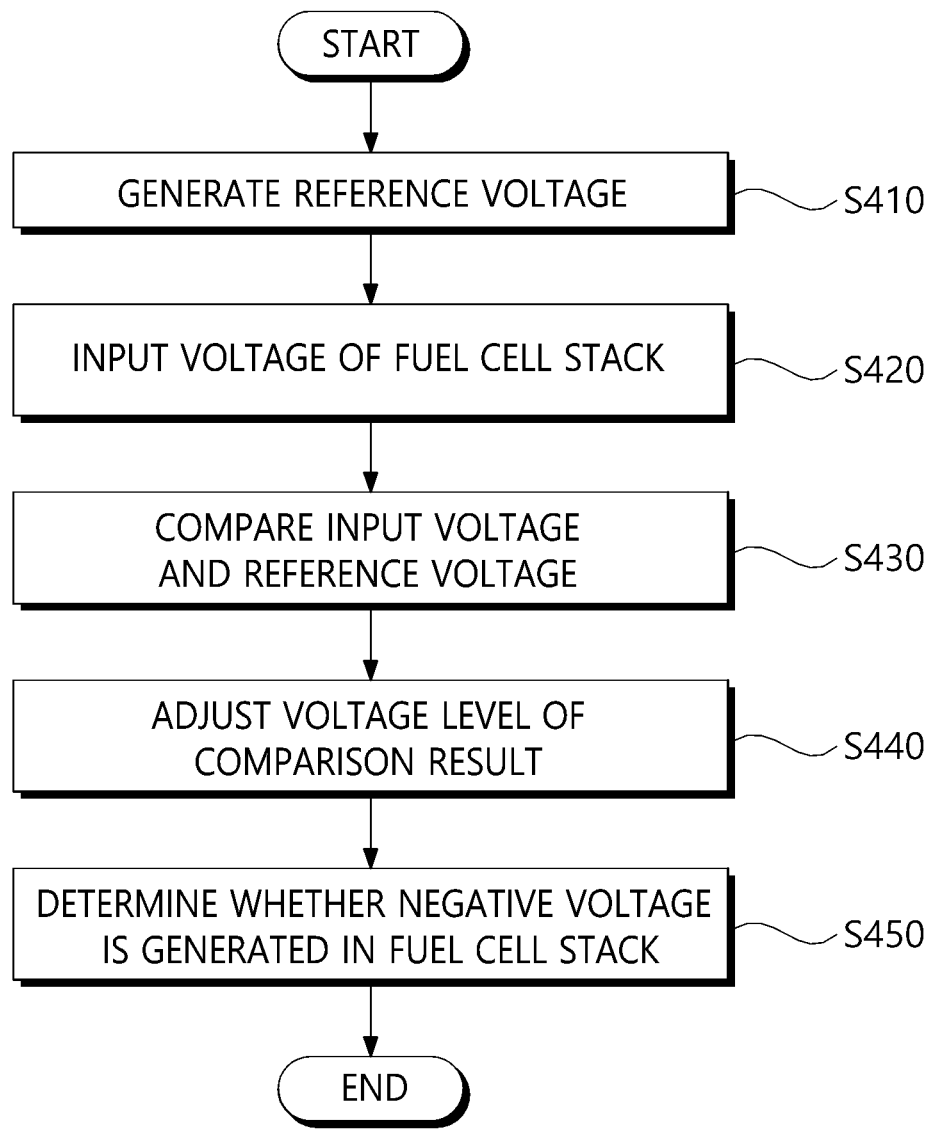
FIG. 4 shows an exemplary method of detecting a voltage of a fuel cell stack according to an exemplary embodiment of the present invention.

FIG. 4 shows an exemplary method of detecting a voltage of a fuel cell stack according to an exemplary embodiment of the present invention.

As shown in FIGS. 1 and 4, the method of detecting a voltage of a fuel cell stack according to an exemplary embodiment of the present invention may include an oscillation step (S410), an input step (S420), a comparison step (S430), an adjustment step (S440), and a determination step (S450).

In the oscillation step (S410), an oscillation unit 121 may output reference voltage based on a positive voltage source and a negative voltage source. The oscillation unit 121 may output reference voltage by further considering a reference duty based on a ground.

In the input step (S420), the comparison unit 123 may receive voltage of a fuel cell stack 200. In this case, a first switch unit 110 is in a turn-on state.

In the comparison step (S430), the comparison unit 123 compares the received input voltage and the reference voltage. The comparison unit 123 may output a comparison result of a high level when the input voltage is greater than the reference voltage. The comparison unit 123 may output a comparison result of a low level when the input voltage is less than the reference voltage.

In the adjustment step (S440), the adjustment unit 125 may adjust a voltage level of the comparison result of the comparison unit 123. The comparison result in which the voltage level is adjusted may be utilized in a low voltage system.

In the determination step (S450), the determination unit 140 determines whether the negative voltage of the fuel cell stack 200 is generated based on the comparison result in which the voltage is adjusted and the reference duty used for the generation of the reference voltage. The determination unit 140 may determine that the negative voltage is generated in the fuel cell stack 200 when a duty of the comparison result in which the voltage is adjusted is less than the reference duty.

The above description just illustrates the technical spirit of the present invention and various changes, modifications, and substitutions can be made by those skilled in the art to which the present invention pertains without departing from an essential characteristic of the present invention. Therefore, the exemplary embodiments and the accompanying drawings disclosed in the present invention are used to not limit but describe the technical spirit of the present invention and the scope of the technical spirit of the present invention is not limited by the exemplary embodiments and the accompanying drawings.

The steps and/or operations according to the present invention may occur in different orders, in parallel, or concurrently in other exemplary embodiments for other epochs or the like, as may be understood by those skilled in the art.

Depending on the exemplary embodiment, at least some or all of the steps and/or operations may be implemented or performed by using commands, programs, and interactive data structures server stored in one or more non-transitory computer-readable media, and one or more processors driving a client and/or a server. The one or more non-transitory computer-readable media may be, by way of example, software, firmware, hardware, and/or any combination thereof. Further, the functions of the "module" discussed in this specification may be implemented by software, firmware, hardware, and/or any combination thereof.

As described above, various exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A voltage detection system of a fuel cell stack, comprising:

a stack detection unit comparing an input voltage and a reference voltage when a voltage of a fuel cell stack is input and outputting a comparison result; and a determination unit determining whether negative voltage is generated in the fuel cell stack based on an output voltage of the stack detection unit and a reference duty used for generation of the reference voltage.

2. The voltage detection system of claim 1, wherein the stack detection unit comprises an oscillation unit outputting the reference voltage by considering the reference duty, a comparison unit comparing the reference voltage and the input voltage, and an adjustment unit adjusting a voltage level for a comparison result of the comparison unit.

3. The voltage detection system of claim 2, wherein the oscillation unit generates the reference voltage based on a positive voltage source and a negative voltage source.

4. The voltage detection system of claim 3, wherein the oscillation unit generates the reference voltage of a triangular wave or sine wave form having a predetermined cycle according to the reference duty.

5. The voltage detection system of claim 2, wherein the comparison unit outputs a comparison result of a high level when the input voltage is greater than the reference voltage, and outputs a comparison result of a low level when the input voltage is less than the reference voltage.

6. The voltage detection system of claim 1, wherein the determination unit determines that the negative voltage is generated in the fuel cell stack when a duty of the output voltage is less than the reference duty.

7. A method of detecting voltage of a fuel cell stack, comprising:

receiving voltage of a fuel cell stack;

comparing an input voltage and a reference voltage; and determining whether negative voltage is generated in the fuel cell stack based on a comparison result of the comparison step and a reference duty used for generation of the reference voltage.

8. The method of claim 7, further comprising:

outputting the reference voltage by considering a positive voltage source, a negative voltage source, and the reference duty before the input step.

9. The method of claim 7, wherein in the comparing the input voltage and the reference voltage, a comparison result of a high level is output when the input voltage is greater than the reference voltage, and a comparison result of a low level is output when the input voltage is less than the reference voltage.

10. The method of claim 7, wherein in the determining whether negative voltage is generated, it is determined that the negative voltage is generated in the fuel cell stack when a duty of the comparison result is less than the reference duty.

11. The voltage detection method of claim 7, further comprising:

an adjustment step of adjusting a voltage level of the comparison result.

* * * * *